United States Patent [19]

Marcus et al.

[11] Patent Number: 4,711,808
[45] Date of Patent: Dec. 8, 1987

[54] BETA PHASE PVF$_2$ FILM FORMED BY CASTING IT ONTO A SPECIALLY PREPARED INSULATING SUPPORT

[75] Inventors: Michael A. Marcus, Honeoye Falls; John E. Benson, Rochester, both of N.Y.

[73] Assignee: Eastman Kodak Company, Rochester, N.Y.

[21] Appl. No.: 830,803

[22] Filed: Feb. 19, 1986

[51] Int. Cl.$^4$ .................. B32B 27/08; B05D 3/06
[52] U.S. Cl. .................................. 428/336; 427/40; 427/41; 427/100; 427/398.1; 428/421; 428/520; 430/937
[58] Field of Search ............... 428/421, 472, 483, 520, 428/522, 336; 361/233; 427/100, 40, 41, 398.1; 430/937

[56] References Cited

U.S. PATENT DOCUMENTS

| | | | |
|---|---|---|---|
| 4,290,678 | 9/1981 | Marcus | 354/128 |
| 4,298,719 | 11/1981 | Mizuno et al. | 526/255 |
| 4,365,283 | 12/1982 | Radice | 361/233 |
| 4,392,178 | 7/1983 | Radice | 361/233 |
| 4,494,841 | 1/1985 | Marcus | 354/21 |

Primary Examiner—Thomas J. Herbert
Attorney, Agent, or Firm—Dana M. Schmidt

[57] ABSTRACT

There are disclosed a novel PVF$_2$ film of beta phase crystalline structure, predominantly, and a method for making it. The beta phase is achieved by first exposing a surface of an insulating polymeric support to an A.C. corona discharge treatment, and then casting molten PVF$_2$ onto that exposed surface while chilling the cast PVF$_2$.

3 Claims, 4 Drawing Figures

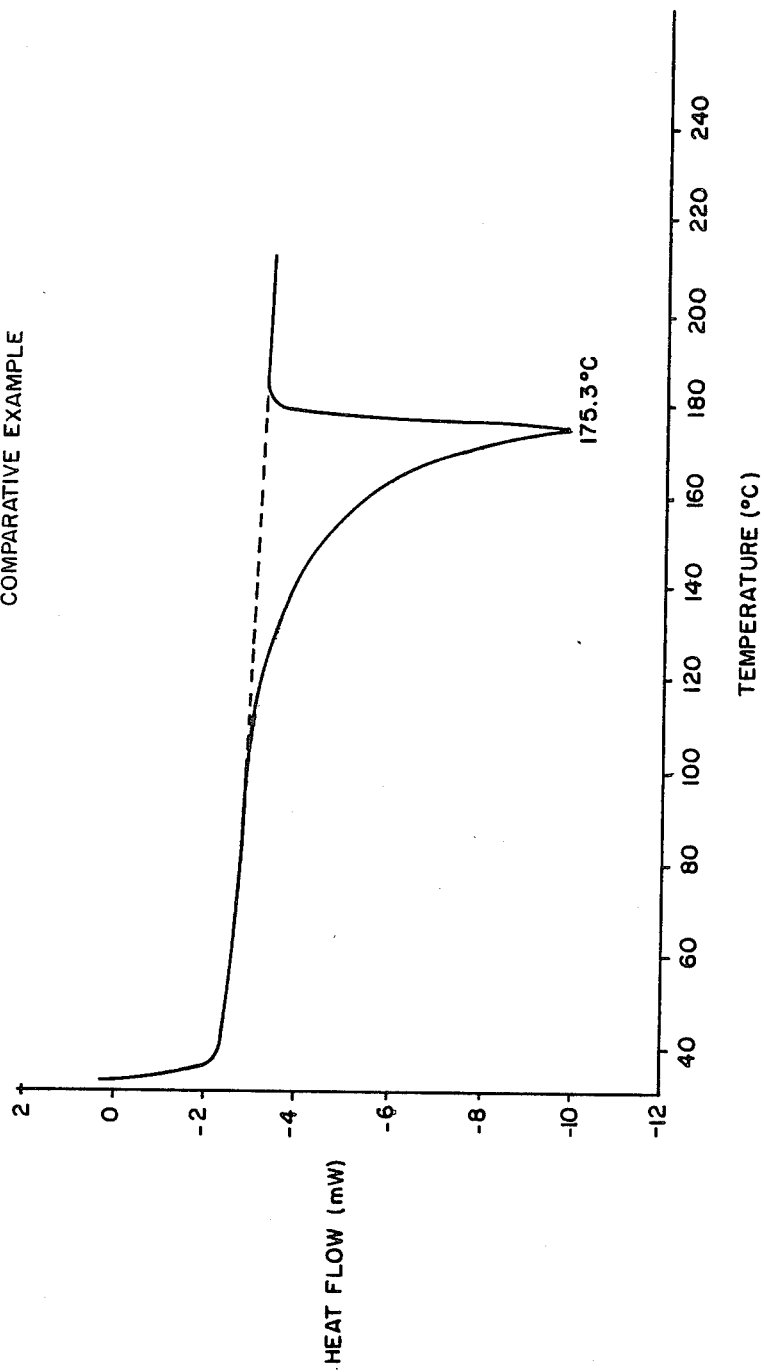

BETA PHASE PVF₂ FILM FORMED BY CASTING IT ONTO A SPECIALLY PREPARED INSULATING SUPPORT

FIELD OF THE INVENTION

This invention relates to films of polyvinylidene fluoride, hereinafter $PVF_2$, and a method for making it. More specifically, it concerns such film in the predominantly beta crystalline phase.

BACKGROUND OF THE INVENTION

In commonly owned, copending U.S. application Ser. No. 577,466, filed on Feb. 6, 1984, as "PVF₂ Film Having Dielectric Constants and Capacitors and Camera Flash Apparatus Incorporating Same" now abandoned in favor of continuation application U.S. Ser. No. 833,431 filed on Feb. 24, 1986, there is described an improved polyvinylidene fluoride film that is particularly useful in making capacitors. For such use, the film requires a high dielectric constant and thicknesses no greater than about 5 μm. Such thinness is used to achieve volumetric efficiencies, that is, to allow wrapping of the electrode-covered film to achieve a maximum number of capacitive plates per transverse thickness.

The film described in the aforesaid application has been very effective in providing the above-noted criteria. However, such film is predominantly alpha phase only, and while having sufficient mechanical strength, it does not have a mechanical strength that is superior. As a result, more care is required in handling such film than would be the case if superior mechanical strengths, such as occur in beta phase film, could be achieved. Furthermore, the production of only alpha phase has meant that the PVF₂ film could not be used, as manufactured, for piezoelectric or pyroelectric properties, which require predominantly beta phase crystalline structure.

It has long been known that alpha phase PVF₂ film is convertable into beta phase film by orienting the film such as by stretching it, either uniaxially or biaxially. Alternatively, U.S. Pat. Nos. 4,392,178 and 4,365,283 teach that conversion from alpha phase to beta phase can can achieved by exposing the already cast PVF₂ film to corona discharge. However, such techniques are time-consuming, particularly if they require biaxial stretching.

Therefore, prior to this invention there has been a need for cast or extruded PVF₂ film which is predominantly beta phase film as cast or extruded, without further processing. As used herein, "predominantly" means, at least 75% by weight of the crystalline structure. Prior to this invention, there was no known method for achieving such a result.

SUMMARY OF THE INVENTION

We have discovered that, for the first time, beta-phase film can be produced without the time-consuming steps of further treating alpha phase film, e.g., without the steps of biaxially stretching the film. (As used herein, "beta phase" means that crystalline structure which generates a peak at 510 cm-1 wave numbers, when examined for infrared spectra.) Additionally, the film so produced has certain properties that are novel for beta-phase crystalline structure, suggesting that there may be different subclasses within the class of beta phase PVF₂ film of which the present invention defines a novel subclass.

More specifically, in accord with one aspect of this invention, there is provided a film of polyvinylidene fluoride having the following properties:
 (a) predominantly beta-phase crystalline structure, and
 (b) melting characteristics defined by two first-time thermal melting peaks of a melting curve, one of which is at least 5° C. lower than the other the lower temperature peak being at least equal in area under the curve to that of the higher temperature peak. As used herein, "melting curve" refers to a plot of heat flow in microwatts versus the heating temperature, for a given polymer.

In accord with another aspect of the invention, there is provided a film of unstretched, unpoled polyvinylidene fluoride having the following properties:
 (a) a thickness no greater than about 10 μm,
 (b) a crystalline structure which is predominantly beta phase, and
 (c) a substrate structure under the exposed surface that contains less weight % of fluorine atoms than is the case for PVF₂ which itself has been subjected to D. C. corona discharge treatment.

In accord with yet another aspect of the invention, such a film is provided preferably by the following method:
 (a) exposing at least one surface of an insulating polymeric support to an A. C. corona discharge for a time, a voltage and a current sufficient to ionize the surface of the support,
 (b) and thereafter casting molten PVF₂ onto exposed surface of the polymeric support while chilling the cast PVF₂ to a temperature that is at least 40° below the melting point of PVF₂.

Thus, it is an advantageous effect of the invention that beta phase PVF₂ film is provided "as cast", without requiring time-consuming additional steps.

It is a related advantageous effect of the invention that PVF₂ film is provided which, in the "as cast" form, has mechanical strength, piezoelectric, and pyroelectric properties that are superior to "as cast" PVF₂ film heretofore available via the prior art.

Other advantageous effects will become apparent upon reference to the following Detailed Discussion, when read in light of the attached drawings.

BRIEF SUMMARY OF THE DRAWINGS

FIGS. 1–4 are melting curves of PVF₂ film wherein heat flow, measured in microwatts, applied to the film is plotted versus the temperature of the film, to measure the behavior of the melting of the film.

FIGS. 1, 2 and 4 are first-time melting curves, whereas FIG. 3 is a remelting curve applied to a cast film of PVF₂ that has already experienced a first-time melting.

DETAILED DISCUSSION OF THE PREFERRED EMBODIMENTS

Figure 1:
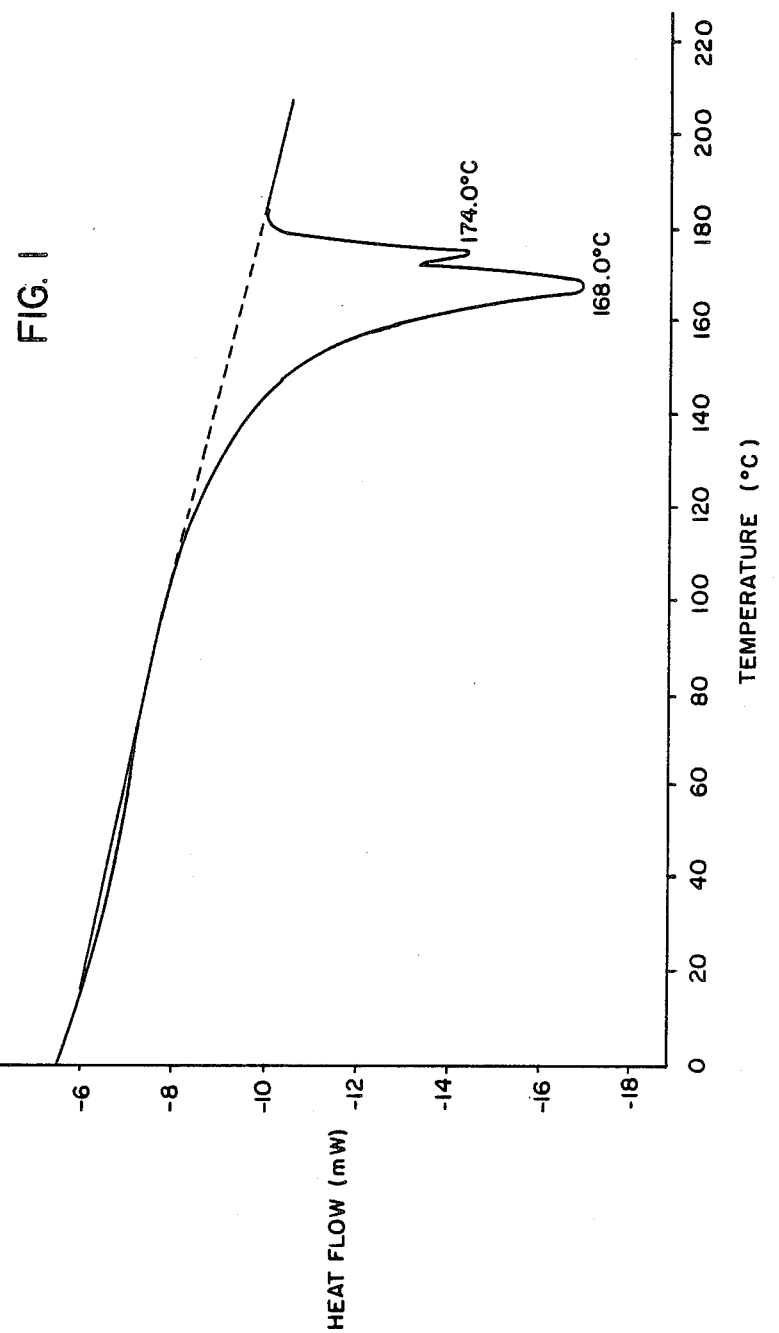

The invention is particularly described hereinafter with regard to the making of PVF₂ in thin film form. In addition, the invention is applicable to the making of PVF₂ in any form, whether it is thin film or in some other form.

This invention is based upon the unexpected discovery that sufficient A. C. corona discharge treatment of an insulating polymeric support will cause PVF₂, when cast onto the surface of such support treated to the corona discharge, to take on the beta phase form as cast. (As used herein, "to cast" means to eject the molten polymer onto whatever support is being used. Such casting includes ejection from extruders.) To be sufficient, the corona discharge should have a charge on the electrode of from about 1000 to about 6000 volts, measured peak to peak, the discharge occurring at a current flow of from about 10 to about 30 amps. As used herein, "A.C." includes a biased A.C., since that also is acceptable. (The frequency is not believed to be critical in that it can be almost any value. Preferred values are from 60 Hertz to 100 KH.) Highly preferred is a corona discharge operating at 600 volts and 30 amps. Conventional A.C. corona discharges that operate within the above-noted ranges are sufficient. The speed at which the polymeric support is advanced through the discharge does not appear to be a factor over the ranges of voltage and frequency noted, so long as ionization occurs.

Any insulating polymeric support can be used to practice this invention. By "insulating", we mean a polymer that has a resistivity of at least $10^8$ ohm-cm. Useful polymers include, e.g., polyesters such as polyethylene terephthalate, polypropylene, polyethylene, and polystyrene, and copolymers of $PVF_2$.

Additionally, it has been found that, during and subsequent to the casting of the $PVF_2$ onto such a support, the $PVF_2$ should be chilled so that it reaches within 5 seconds a temperature that is at least 40° C. below $PVF_2$'s melting point, that is, a temperature no higher than about 130° C. Most preferably, this is done by maintaining the polymeric support at a temperature no greater than 24° C. as the support is fed into the casting area.

Optionally, it is also preferred, but not necessary to keep the cast film from necking in. Otherwise, the entire width of the support will not be utilized. Most preferably, this is done by passing the cast $PVF_2$ under a nip roller immediately after it is cast, the gap of such nip roller being set at the nominal thickness of the extrusion plus the thickness of the support.

The resulting $PVF_2$ film can then be stripped from the support. It is crystalline with a phase structure that is predominantly beta phase, that is, at least 75% by weight. As such, it has superior mechanical strength, piezoelectric, and pyroelectric properties compared to alpha phase film. Depending on the gap of the casting mechanism, e.g., the extruder die, the thickness of the $PVF_2$ film as cast will be from 1 to about 50 μm. Most preferably in the manufacture of capacitor dielectric, the thickness does not exceed about 10 μm because the trend in electronic components is towards miniaturization.

At least some of the beta phase $PVF_2$ film of this invention is distinguishable in its substructure from such conventional film in which the beta phase is induced by exposing the $PVF_2$ film to high D.C. corona discharge. In the latter case, the subsurface of the film shows a very high % of the atoms being fluorines. This subsurface structure is caused by a rotation of the dipoles to orient the fluorines upwardly towards the surface. This is not the case with the $PVF_2$ film of the invention produced by A.C. corona discharge not having a net bias. Instead, there is at least 10 weight % less concentration of fluorine atoms adjacent the surface, compared to the prior art product.

Thereafter, the film can be poled by conventional techniques so as to make fullest use of its piezoelectricity.

The film's beta phase characteristic is determined from infrared absorption spectroscopy as described, e.g., in U.S. Pat. No. 4,298,719, col. 5, lines 23-42. Specifically, the absorption spectroscopy curve is examined for curve values at 510 and at 530 cm-1, the 510 peak being characteristic of the beta phase whereas the 530 peak is characteristic of alpha phase. By measuring the area under the curve for each peak, the weight % of the crystalline phase is assigned by using the equation $$\% = D_{510}/(D_{510}+D_{530}) \times 100,$$

wherein $D_X$ is the area under the curve for the 510 peak or the 530 peak.

Consistent with the film's production of predominantly a 510 peak, it is believed that the beta phase herein produced may be a novel variation of the conventional beta phase known in the art. The reason is that all of the film of this invention has a first-time melting curve that is unique. FIG. 1 is such a curve, produced from $PVF_2$ homopolymer having an inherent viscosity of about 0.7 at 24° C., and cast at a nominal extruder thickness of 7 μm onto an A. C. corona-discharge-treated (600 volts) polyethylene terephthalate support kept at a temperature of 24° C. That is, the heat flow is measured in a conventional way as a function of temperature, and the dip in the curve is an indication of the melting of the polymer. However, the polymer goes through two melting stages, the first of which is at a temperature that is approximately 6° C. lower than the second. In addition, much more is melted in the first melting stage, as is evidenced by the fact that the lower temperature melting peak has an area under the curve at least equal to, and in fact in excess of, the area under the curve of the higher temperature melting peak. (Such area is measured "under" the curve by inverting the graph of FIG. 1 and measuring the area, as is conventional. Alternatively, without inverting the graph, it is the area above the curve.) Quantitatively, the area for the 168.0° C. peak is about 48.3 Joules/g, whereas the area for the 174.6° C. peak is about 9.29 Joules/g.

The exact temperature at which the two peaks form appears to be somewhat a function of the inherent viscosity of the $PVF_2$ before casting. Thus, the $PVF_2$ of FIG. 2 had an inherent viscosity of about 1.1, which is about 40% higher than that of the $PVF_2$ of FIG. 1. The film was cast by the procedure of that of FIG. 1. The lower temperature peak occured at a temperature of 168.4° C., which is 0.4° C. higher than that of the $PVF_2$ of FIG. 1. The higher temperature peak occurred at 174.7° C., which is only 0.1° C. higher than that of the $PVF_2$ of FIG. 1. The area under the lower temperature peak curve was 51.0 Joules/g, while the higher temperature peak area was 8.12 Joules/g. As with FIG. 1, the area of the lower temperature peak greatly exceeded that of the higher temperature peak.

Figure 3:
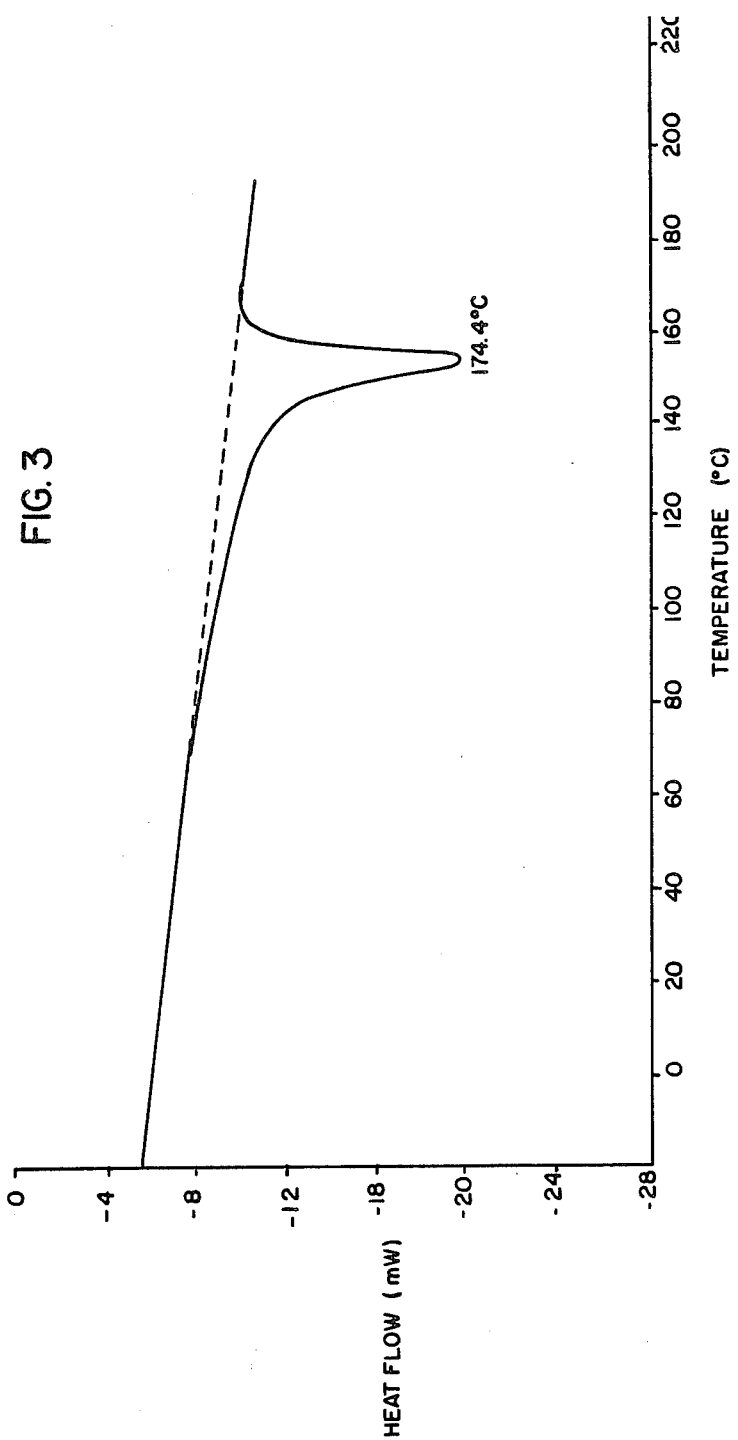

It will be appreciated that the aforedescribed first-time melting peaks are determinable only by destructive testing. That is, following melting, the beta phase structure is lost and the remelt curves are entirely different. FIG. 3 is such a remelt curve of the sample of FIG. 1.

As a Comparative Example, a conventional $PVF_2$ film was prepared by a procedure believed to be equivalent to that described in U.S. Pat. No. 4,298,719, issued on Nov. 3, 1981. That is, a homopolymer of vinylidene fluoride of an inherent viscosity of 0.7 was extruded as a sheet having a nominal thickness of 160 μm. This was then uniaxially stretched in the extrusion direction at a temperature of 80° C. to a stretch ratio of 4X. Thereafter, it was given a stretching in the perpendicular direction at a temperature of 120° C. to a stretch ratio of 4X, to complete the conversion to beta phase crystalline structure by biaxial orientation of the film. When this was run through a first-time melting procedure, only a single peak at 175.3° C. was observed, FIG. 4, producing an area under the curve of 59.1 Joules/g. Interestingly, this is about the sum of the two areas under the curve for the two peaks of FIG. 2.

Figure 2:
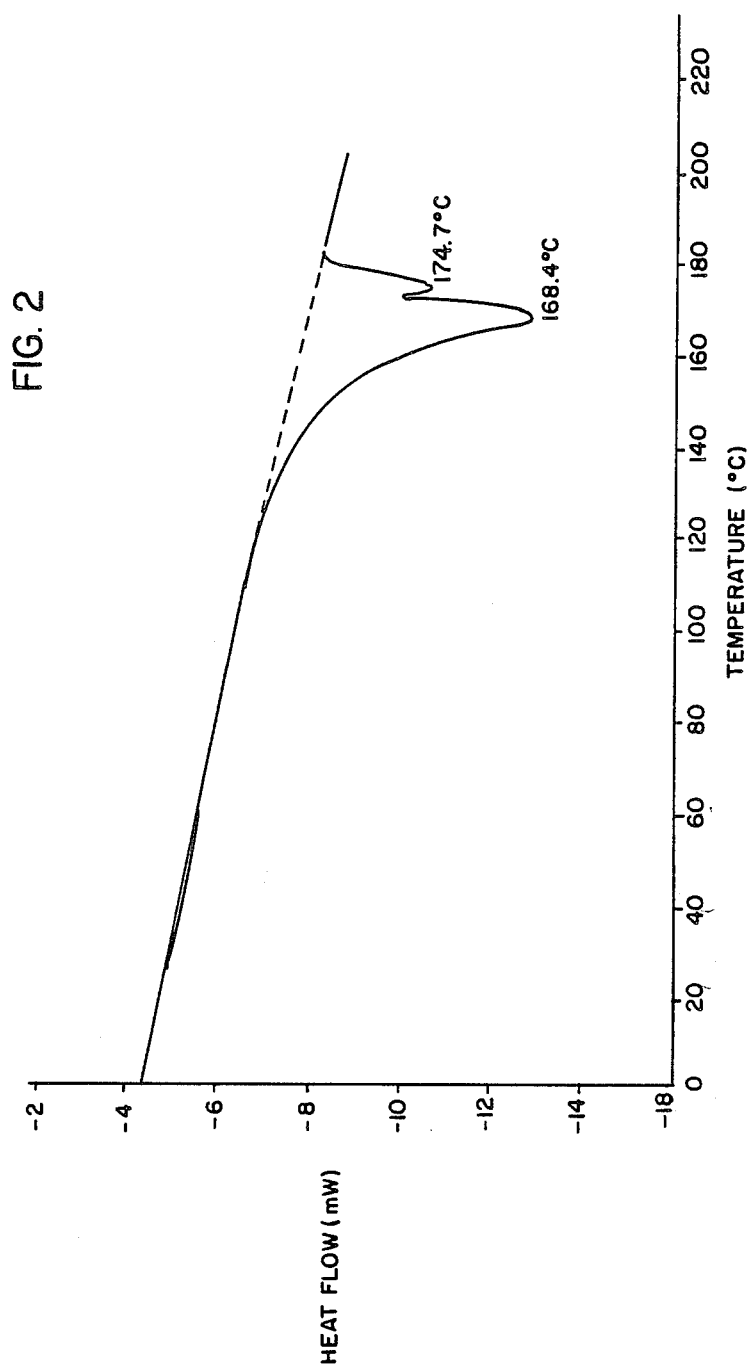

Additional comparative examples have been prepared, not shown, wherein the sole difference from the film of FIGS. 1 and 2 was that the polymeric support was not given a preliminary corona discharge treatment. The result was that the cast $PVF_2$ film was exclusively alpha phase in crystalline structure, as determined by the above-described infrared absorption spectroscopy procedure.

The invention has been described in detail with particular reference to preferred embodiments thereof, but it will be understood that variations and modifications can be effected within the spirit and scope of the invention.

What is claimed is:

1. A film of unstretched, unpoled polyvinylidene fluoride having the following properties:
   (a) a thickness no greater than about 10 μm,
   (b) a crystalline structure which is predominantly beta phase and,
   (c) a subsurface structure that contains less weight % of fluorine atoms than is the case for $PVF_2$ which itself has been subjected to D. C. corona discharge treatment.

2. A method of making beta-phase $PVF_2$ film comprising
   (a) exposing at least one surface of an insulating polymeric support to an A.C. corona discharge for a time, a voltage and a current sufficient to ionize the surface of the support,
   (b) and thereafter casting molten $PVF_2$ onto said exposed surface of said polymeric support while chilling the cast $PVF_2$ to a temperature that is at least 40° C. below the melting point of $PVF_2$ without subsequent stretching of the chilled film.

3. A method as defined in claim 1, wherein said casting step is done while preventing said extruded $PVF_2$ from necking in.

* * * * *